United States Patent [19]
Pansier et al.

[11] Patent Number: 5,892,355
[45] Date of Patent: Apr. 6, 1999

[54] CURRENT AND VOLTAGE-SENSING

[76] Inventors: Frans Pansier; Antonius A. M. Marinus; Henricus C. J. Buthker, all of Groenewoudseweg 1, 5621 BA Eindhoven, Netherlands

[21] Appl. No.: 939,550

[22] Filed: Sep. 29, 1997

[30] Foreign Application Priority Data

Mar. 21, 1997 [EP] European Pat. Off. .............. 97200856

[51] Int. Cl.⁶ .............................. G05F 3/26; H02M 3/335
[52] U.S. Cl. ............................................. 323/315; 363/21
[58] Field of Search ................................ 363/20, 21, 78, 363/95, 97; 323/312, 315

[56] References Cited

U.S. PATENT DOCUMENTS

| | | | |
|---|---|---|---|
| 5,262,713 | 11/1993 | Agiman | 323/315 |
| 5,264,782 | 11/1993 | Newton | 323/288 |
| 5,418,674 | 5/1995 | Davies et al. | 361/18 |
| 5,666,043 | 9/1997 | Henry et al. | 323/277 |
| 5,680,034 | 10/1997 | Redl | 363/21 |

FOREIGN PATENT DOCUMENTS

0585789A1  3/1994  European Pat. Off. ....... H02M 3/335

OTHER PUBLICATIONS

"Motorola Semiconductor Technical Data High Flexibility Green SMPS Controller: Fixed Frequency, Variable Frequency, Standby Mode" MC44603, No date.

*Primary Examiner*—Adolf Deneke Berhane
*Attorney, Agent, or Firm*—Edward W. Goodman

[57] ABSTRACT

An integrated circuit (1) includes a voltage-sensing circuit (2) and a current mirror (3) for sensing both a voltage (Vi) and a current (Ii) at one input terminal (T) of the integrated circuit. The voltage-sensing circuit (2) has an input which is connected to the input terminal (T) and an output which supplies a voltage level indication (Vu). The current mirror (3) has an input which is also connected to the input terminal (T), a reference terminal which is connected to a reference potential, and an output which supplies an output current (Iu). The input of the current mirror has a high impedance as long as the voltage level (Vi) is below a threshold voltage (Vth) of the current mirror (3). Within a voltage range determined by this threshold voltage (Vth), the voltage level indication (Vu) is a measure of the voltage level (Vi). The current mirror (3) becomes active and the output current (Iu) is a mirrored input current (Ii) if the voltage level (Vi) exceeds the threshold voltage (Vth). The threshold voltage may be determined by an input transistor (T1) of the current mirror (3). This input transistor (T1), which is arranged as a diode, starts conducting when the voltage level (Vi) reaches the threshold voltage (Vth) of this diode.

6 Claims, 3 Drawing Sheets

CURRENT AND VOLTAGE-SENSING

BACKGROUND OF THE INVENTION

1. Field of the Invention

The invention relates to a circuit for sensing both a current and a voltage.

It is known to sense a voltage and a current by using different circuits. One of the circuits receives the voltage, the other circuit receives the current. An integrated circuit which comprises both circuits needs two terminals to be able to sense the voltage and a current separately. As the cost of the integrated circuit depends on the amount of terminals needed, it is a drawback of the known integrated circuit that two terminals have to be used.

2. Description of The Related Art

It is an object of the invention to perform both an accurate current and voltage sensing at the same terminal of an integrated circuit.

A first aspect of the invention provides a circuit for sensing both a current and a voltage level at one input terminal of an integrated circuit.

A second aspect of the invention provides a power supply comprising such a circuit for sensing both a current and a voltage at one input terminal of an integrated circuit.

A current mirror input and a voltage-sensing circuit are both coupled to the same input terminal. The input of the current mirror has a threshold voltage which, in the case of a conventional two-transistor current mirror, is caused by the input transistor. The threshold voltage is the base-emitter voltage of a bipolar input transistor, or the gate source-threshold voltage of a field effect input transistor. The threshold voltage may be increased by using more than one input transistor arranged in series, or by supplying a reference voltage to the emitter or source of the input transistor. The threshold voltage may be defined with respect to a ground terminal (in the case of a npn input transistor) or with respect to another supply terminal (in the case of a pnp input transistor).

The current mirror will be inactive if the voltage at the input terminal does not exceed the threshold voltage of the input of the current mirror. In this situation, the current mirror has a very high input impedance and the voltage at the input terminal is free to vary. The voltage-sensing circuit supplies a voltage level indication which has a value corresponding to the voltage at the input terminal.

The current mirror will be active if the voltage at the input terminal exceeds the threshold voltage. Now, the voltage at the input of the current mirror will be substantially constant and, consequently, the voltage-sensing circuit cannot sense any voltage variations. The active current mirror mirrors the input current supplied to the input terminal to obtain an output current which has a fixed relation with the input current.

EP-A-0585789 discloses a three-terminal switched-mode power supply integrated circuit with one terminal which accepts a combination of a feedback signal and a supply voltage to operate the chip. Inside the chip, a feedback extraction circuit separates the feedback signal from the power supply voltage by sensing the excess current flowing through a shunt regulator. The IC comprises an error amplifier which compares a tapped voltage on the terminal with a band-gap reference voltage. The output of the error amplifier drives a shunt transistor. As long as a sufficient supply current is fed to the terminal, the voltage on the terminal will be stabilized and any excess current will be shunted to ground. This excess current is mirrored and converted into an extracted feedback voltage. The error amplifier of the prior art senses the voltage at the terminal to stabilize this voltage at a desired value, such that it can be used as a supply voltage for the IC. The value of the stabilized voltage has to be chosen above the threshold of the input of the current mirror to be able to measure an excess current at this stabilized voltage. The error amplifier thus senses the voltage at the terminal in a voltage range in which the current mirror draws current. Thus, in this voltage range, the current mirror does not have a high input impedance. Consequently, the prior art circuit does not sense the voltage at the terminal within a certain range in which the current mirror is inactive (and the current mirror has a high input impedance) to supply a voltage level indication dependent on the sensed voltage in this range.

To further elaborate on the difference between the prior art and the invention, a practical application in a power supply will be described below. The prior art uses the same terminal of the IC to receive both the power supply voltage of the IC and feedback information for regulating the power supply. The invention uses the same terminal to receive an input voltage from a winding of the power supply transformer via an impedance. As long as the input voltage at the input terminal is below the threshold voltage of the current mirror, the circuit according to the invention can detect whether the input voltage crosses a predetermined voltage level. This detection can be used to generate a demagnetization protection signal. Above the threshold value of the current mirror, the current mirror is active and supplies the output current which is a mirrored input current. The input current represents the feedback information.

These and other aspects of the invention are apparent from and will be elucidated with reference to the embodiments described hereinafter.

DESCRIPTION OF THE PREFERRED EMBODIMENTS

Figure 1:
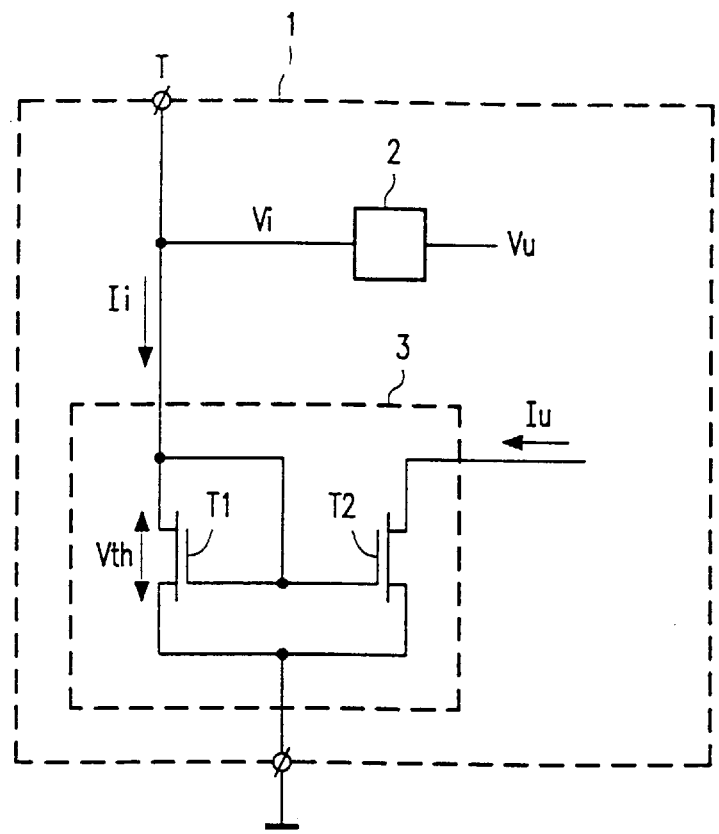
FIG. 1 shows an integrated circuit comprising a voltage-sensing circuit and a current mirror for sensing both a voltage and a current at one input terminal of the integrated circuit.

FIG. 1 shows an integrated circuit which comprises a voltage-sensing circuit 2 and a current mirror 3 for sensing both a voltage level Vi and a current Ii at one input terminal T of the integrated circuit. The voltage-sensing circuit 2 has an input connected to the input terminal T and an output supplying a voltage level indication Vu. The current mirror 3 has an input connected to the input terminal T, a reference terminal connected to ground potential and an output supplying an output current Iu. The current mirror comprises an input transistor T1 with a drain connected to the input terminal T, a source connected to the reference terminal, and a gate connected to the drain of the input transistor T1 and to a gate of an output transistor T2. The output transistor T2 has a source connected to the reference terminal and a drain connected to the output of the current mirror.

The input transistor T1 has a high impedance as long as the voltage at its drain and gate, with respect to the source, is lower than the threshold voltage Vth of the input transistor T1. In this case, the current mirror 3 is inactive. Within this voltage range, the voltage at the input terminal T can be measured with the voltage-sensing circuit 2. The voltage level indication Vu is a measure of the voltage at the input terminal T.

The input transistor T1 of the current mirror starts conducting if the voltage at the input terminal reaches the threshold voltage Vth. The current mirror 3 becomes active and the output current Iu is a mirrored version of the input current Ii flowing into the input terminal T.

The conductive input transistor T1, which is arranged as a diode, stabilizes the input voltage Vi at the input terminal T on the value of the threshold voltage Vth. The voltage range, in which the current mirror 3 is inactive and the voltage-sensing circuit 2 is thus able to sense the voltage Vi at the input terminal without influence by the current mirror 3, can be adapted by selecting the appropriate threshold voltage Vth of the input transistor T1. This is easy if the transistors T3, T2 are field effect transistors as is shown in FIG. 1. It is also possible to connect the sources of the transistors T1 and T2 to a desired reference voltage.

Although a current mirror 3 is shown with n-channel field effect transistors T1, T2 and with a reference terminal connected to ground, it is also possible to use p-channel field effect transistors with their sources connected to a supply terminal. Also bipolar transistors can be used.

Figure 2:
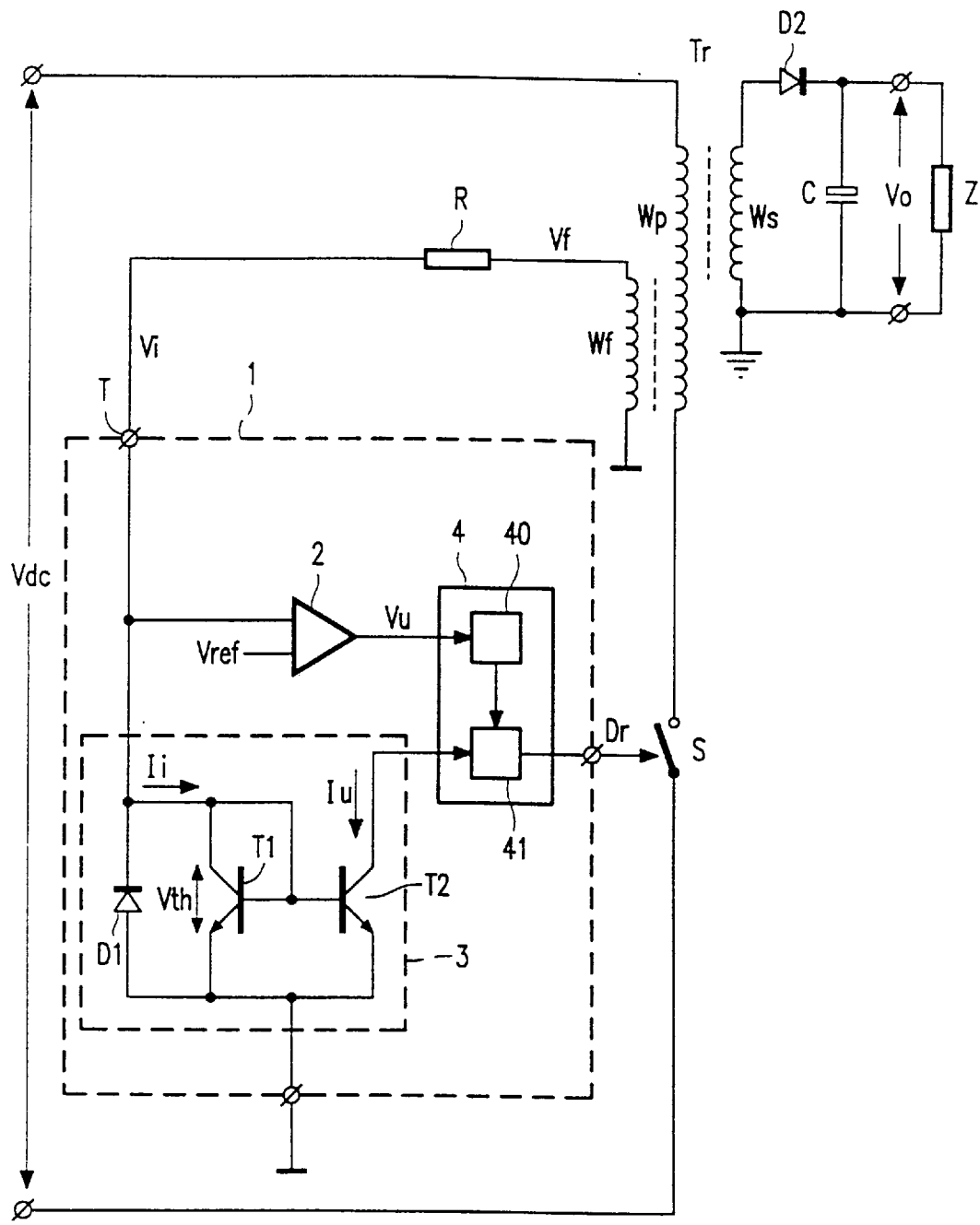
FIG. 2 shows a power supply comprising an integrated circuit having one terminal to which a voltage-sensing circuit and a current-sensing circuit are coupled according to the invention.

FIG. 2 shows a switched-mode power supply comprising an integrated circuit 1. The integrated circuit 1 comprises a voltage-sensing circuit 2. The voltage-sensing circuit 2 has a first input connected to an input terminal T of the integrated circuit 1, a second input receiving a reference voltage Vref and an output supplying an output voltage Vu to a first input of a drive circuit 4. The integrated circuit 1 further comprises a current mirror 3 which has an input connected to the input terminal T, a reference terminal connected to ground, and an output supplying an output current Iu to a second input of the drive circuit 4.

The current mirror 3 comprises an input transistor T1 with a collector connected to the input terminal T, an emitter connected to the reference terminal and a base connected to the collector of the input transistor T1 and to a base of an output transistor T2. The output transistor T2 has an emitter connected to the reference terminal and a collector connected to the second input the drive circuit 4. The drive circuit 4 has an output to supply control pulses Dr to a controllable switching device S which is arranged in series with a primary winding Wp of a transformer Tr. The series arrangement of the primary winding Wp and the controllable switching device receives a DC input voltage Vdc. The DC input voltage Vdc may be a rectified line voltage. The control pulses Dr periodically cause the controllable switching device S to have a low impedance and a high impedance. During the low impedance period, a current through the primary winding Wp increases, and during the high impedance period, the energy in the primary winding Wp is transferred to a secondary winding Ws of the transformer Tr in order to supply power to a load Z. A series arrangement of a rectifying diode D2 and a smoothing capacitor C is connected across the secondary winding Ws to supply a rectified voltage Vo to the load Z which is connected in parallel with the smoothing capacitor C.

Transformer Tr has a further winding Wf which supplies a feedback voltage Vf and is connected via a resistor R to the terminal T of the integrated circuit 1. A diode D1 is connected between the terminal T and the reference terminal to prevent a too large negative voltage across the circuits in the integrated circuit 1. This diode D1 is not relevant to the invention and does not need to be positioned in the integrated circuit 1.

The drive circuit 4 comprises a control circuit 41 which receives the output current Iu to supply a drive signal to the controllable switching device S for alternately switching the controllable switching device S on and off. The control circuit 41 controls a duty cycle or frequency of the drive signal in response to the output current Iu for stabilizing the feedback voltage Vf. The drive circuit 4 further comprises a demagnetization protection circuit 40 which receives the output voltage Vu to supply a demagnetization protection signal to the control circuit 41 for preventing switch-on of the controllable switching device S as long as energy is transferred to the secondary winding Ws. A demagnetization protection is known per se from the Motorola Semiconductor technical data "High Flexibility Green SMPS Controller" MC44603.

The operation of the switched-mode power supply will be elucidated below with reference to the waveforms shown in FIGS. 3A–3D.

Figure 3A:
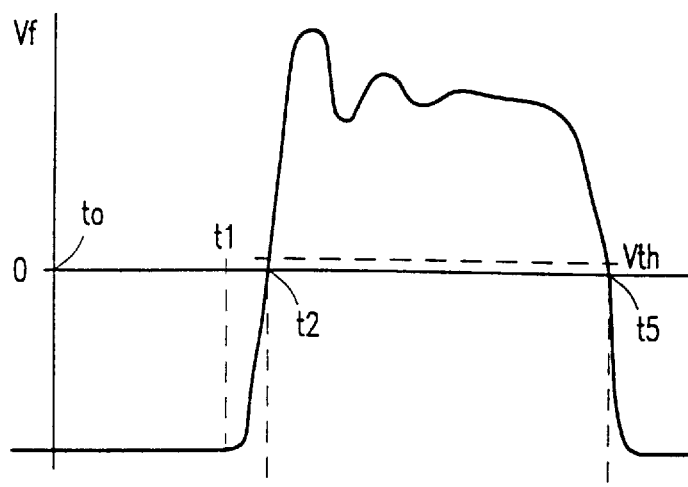
FIGS. 3A–3D show waveforms explaining the operation of the voltage and current-sensing circuits.

FIG. 3A shows the feedback voltage Vf supplied by the further winding Wf.

Figure 3B:
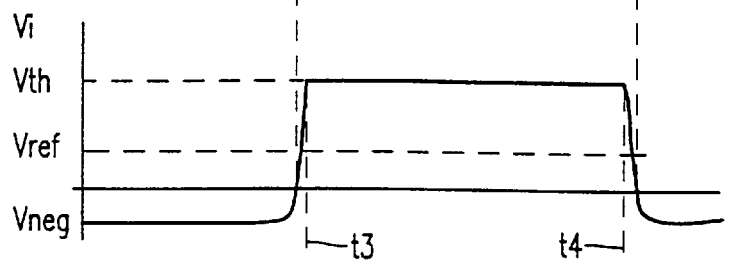

FIG. 3B shows the input voltage Vi at the input terminal T.

Figure 3C:
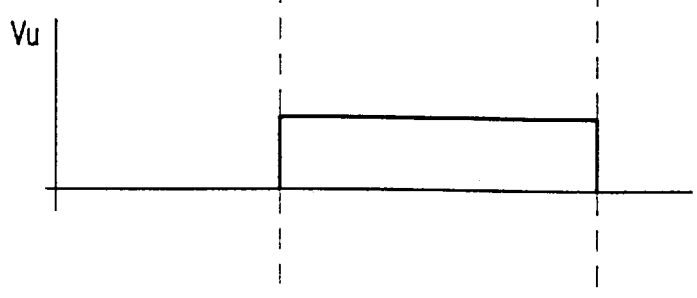

FIG. 3C shows the output voltage Vu of the voltage-sensing circuit 2.

Figure 3D:
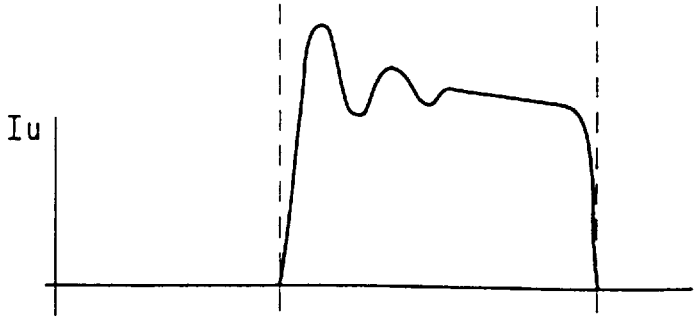

FIG. 3D shows the output current Iu of the current mirror 3.

At t0, the controllable switching device S is conductive, while the feedback voltage Vf and the input voltage Vi are negative. The input voltage Vi is limited at a value Vneg by a voltage-limiting circuit which in this case is the diode D1. At instant t1, the controllable switching device S is controlled to become non-conductive, so that the feedback voltage Vf and the input voltage Vi increase in order to become positive. The input voltage Vi equals the threshold voltage Vth due to a conductive input transistor T1 of the current mirror 3 as long as the feedback voltage Vf exceeds this threshold voltage Vth.

The output voltage Vu has a high level during the period t3–t4 when the input voltage Vi is higher than the reference voltage Vref. In an embodiment of the invention, the output voltage Vu is used to obtain the well-known demagnetization protection for preventing activation of the controllable switching element S as long as energy is transferred to the secondary winding Ws.

The output current Iu represents the current flowing through the resistor R during the period when the feedback voltage Vf is above the threshold voltage Vth. In an embodiment of the invention, the output current Iu is used to stabilize the feedback voltage Vf and the rectified voltage Vo coupled therewith. The resistor R may be replaced by a suitable impedance.

If transistors T1 and T2 are p-channel FETs, a value of the reference voltage Vref has to be selected above the threshold voltage Vth occurring at the input terminal T when the current mirror 3 is active.

The reference terminal to which the emitters of the transistors T1 and T2 are connected may also be connected to a negative or positive reference voltage. In this way it is possible to select a desired threshold voltage Vth for determining when the current mirror 3 is inactive.

According to the above, the invention can be advantageously used in an integrated controller IC of a switched-mode power supply, in which only a single terminal of the controller IC is needed to be able to detect voltage information for the demagnetization protection and current information to control the controllable switching device to stabilize output voltages.

It will be clear that the voltage-sensing circuit 2 and the current mirror 3, according to the invention, may also be used in other applications where it is important to use one and the same terminal to measure a voltage and a current.

The invention has been described with reference to preferred embodiments, but it will be understood that modifications thereof within the principles outlined above will be evident to those skilled in the art, so that the invention is not limited to the preferred embodiments but is intended to encompass such modifications.

We claim:

1. A circuit for sensing both an input current and an input voltage at one input terminal (T) of an integrated circuit, the integrated circuit comprising a voltage-sensing circuit having an input coupled to the input terminal to supply a voltage level indication, and a current mirror having an input coupled to said input terminal for receiving the input current, and an output for supplying an output current, the current mirror being active when the input voltage exceeds a threshold voltage, the voltage level indication having a value corresponding to the voltage (Vi) at the input terminal when the voltage at the input terminal does not exceed the threshold voltage.

2. A circuit for sensing both an input current and an input voltage at one input terminal as claimed in claim 1, characterized in that the voltage-sensing circuit comprises a voltage comparator having an input coupled to the input terminal for comparing the voltage at the input terminal with a reference value to supply the voltage level indication for indicating whether the voltage at the input terminal falls below or exceeds the reference level, wherein the reference value is selected within a range determined by the threshold voltage to compare the voltage at the input terminal when the voltage at the input terminal does not exceed the threshold voltage.

3. A circuit for sensing both an input current and an input voltage at one input terminal as claimed in claim 1, characterized in that the current mirror comprises an input transistor and an output transistor, the base and collector of the input transistor being interconnected and the emitter being coupled to a reference terminal, the base-emitter junction providing the threshold voltage, the base of the output transistor being coupled to the base of the input transistor, the emitter being coupled to the reference terminal and the collector supplying the mirrored output current.

4. A power supply comprising:

a transformer having a primary winding and a further winding, a series arrangement of the primary winding and a controllable switching device being coupled to receive a DC input voltage;

an integrated controller circuit having an output for supplying drive pulses to the controllable switching device, the integrated controller circuit having an input terminal coupled to the further winding via an impedance, the integrated controller circuit comprising a voltage-sensing circuit having an input coupled to the input terminal for supplying a voltage level indication, and a current mirror having an input coupled to said input terminal for receiving the input current, and an output for supplying an output current, the current mirror being active when the input voltage exceeds a threshold voltage, the voltage level indication having a value corresponding to the voltage at the input terminal when the voltage at the input terminal does not exceed the threshold voltage.

5. A power supply as claimed in claim 4, characterized in that the integrated controller circuit further comprises a control circuit coupled to receive the output current to control the drive pulses for stabilizing a feedback voltage supplied by the further winding.

6. A power supply as claimed in claim 5, characterized in that the integrated controller circuit further comprises a demagnetization protection circuit coupled to receive the voltage level indication for supplying a demagnetization protection signal to the control circuit for preventing switch-on of the controllable switching device as long as energy is transferred from the primary winding to the secondary winding.

* * * * *